United States Patent [19]
Sauer

[11] Patent Number: 5,600,696
[45] Date of Patent: Feb. 4, 1997

[54] DUAL-GAIN FLOATING DIFFUSION OUTPUT AMPLIFIER

[75] Inventor: Donald J. Sauer, Allentown, N.J.

[73] Assignee: David Sarnoff Research Center, Inc., Princeton, N.J.

[21] Appl. No.: 541,164

[22] Filed: Oct. 11, 1995

[51] Int. Cl.⁶ .......................... G11C 19/28; H01L 29/768
[52] U.S. Cl. .............................................. 377/60; 257/239
[58] Field of Search ................................ 377/60; 257/239

[56] References Cited

U.S. PATENT DOCUMENTS

| | | | |
|---|---|---|---|
| Re. 30,087 | 8/1979 | White et al. | 377/60 |
| 4,309,624 | 1/1982 | Hynecek et al. | 377/60 |
| 4,454,435 | 6/1984 | Burns | 377/60 |
| 4,513,431 | 4/1985 | Chamberlain et al. | 257/239 |
| 4,528,684 | 7/1985 | Iida et al. | 377/60 |
| 4,538,287 | 8/1985 | Roberts et al. | 377/60 |
| 4,603,426 | 7/1986 | Sauer | 377/60 |
| 4,683,580 | 7/1987 | Matsunaga | 377/60 |
| 4,803,531 | 2/1989 | Riley et al. | 377/60 |
| 4,809,307 | 2/1989 | Sakaue et al. | 377/60 |
| 4,811,371 | 3/1989 | Tower | 377/60 |
| 4,993,053 | 2/1991 | Itoh et al. | 377/60 |
| 5,225,695 | 7/1993 | Naka et al. | 257/239 |
| 5,227,650 | 7/1993 | Noguchi et al. | 257/239 |
| 5,306,932 | 4/1994 | Miwada | 257/239 |

*Primary Examiner*—Gene M. Munson
*Attorney, Agent, or Firm*—William J. Burke

[57] ABSTRACT

A time-multiplexed floating diffusion output amplifier provides two output signals with different gains for each signal charge packet by dynamically controlling the floating diffusion capacitance using two external reset clocks. Two correlated double sampling circuits separately remove the noise components associated with resetting the two different floating diffusion capacitance values.

9 Claims, 3 Drawing Sheets

DUAL-GAIN FLOATING DIFFUSION OUTPUT AMPLIFIER

This invention relates to an amplification device, and more particularly, to a floating diffusion amplifier permitting optimization of the signal-to-noise ratio as well as large signal handling capacity.

BACKGROUND OF THE INVENTION

In a floating diffusion amplifier, it is desirable to minimize the capacitance on the floating diffusion in order to obtain the highest charge-to-voltage conversion gain and thus the best possible signal-to-noise ratio (SNR) performance. Typically, however, the input capacitance of a source follower transistor connected to the floating diffusion is a large fraction of the total capacitance. Since the noise level of the source follower is generally inversely proportional to the transistor size (e.g., $1/\sqrt{w}$), whereas the input capacitance is directly proportional to the transistor size, there is an optimum size for maximizing the SNR. For state of the art processes, the optimum floating diffusion capacitance for achieving the best SNR is about 20 fF, which corresponds to an output sensitivity of about 8 µV/electron.

If the floating diffusion amplifier is optimized for maximum SNR performance, the resulting high output sensitivity limits the maximum signal capacity for linear operation to about 250 K electrons full well (about 2 volts peak-to-peak output signal). Practically, it is difficult to design for larger signal voltage swings due to limitations of the linear dynamic range which are determined by the output transfer gate potential and the floating diffusion reset potential.

Therefore, a standard floating diffusion amplifier design cannot be optimized to simultaneously provide the best SNR for low level signals as well as provide large signal handling capacity, greater than 250 K electrons, which is desirable to increase dynamic range.

SUMMARY OF THE INVENTION

The present invention is embodied in a floating diffusion amplifier. A time-multiplexed floating diffusion output design provides two output signals with different gains for each signal charge packet by dynamically controlling the floating diffusion capacitance using two external reset clocks. The readout timing sequence is designed for use with two correlated double sampling (CDS) circuits which separately remove the kTC noise components associated with resetting the two different floating diffusion capacitance values. Using this technique, the floating diffusion amplifier may be optimized to achieve the best SNR in the high gain setting while simultaneously providing very high signal handling capacity.

According to one aspect of the invention, at least two CDS circuits follow the floating diffusion amplifier and are constructed on the same semiconductor substrate as a buried channel charge-coupled device (CCD).

DETAILED DESCRIPTION

In a CCD device, information is stored in the storage wells of the device. To "read" what is stored in the wells, the charge in each well must be transferred to a location where it can be "read" and amplified. In the present invention it is transferred to a storage well beneath a floating diffusion region which is an element in the floating diffusion amplifier. The detailed operation of the floating diffusion amplifier structure will now be described with reference to FIG. 1 and FIG. 2.

Figure 1:
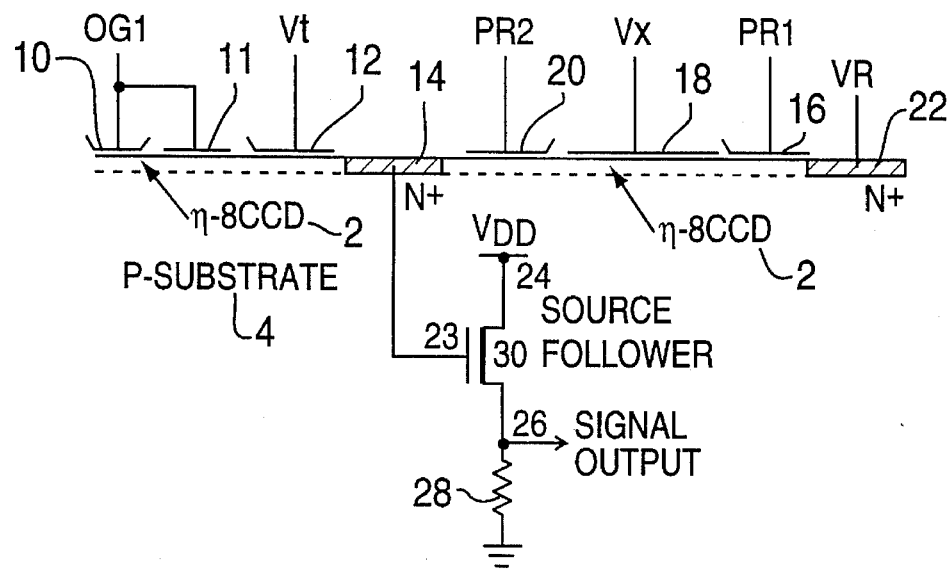
FIG. 1 is a schematic diagram of an exemplary buried channel floating diffusion output stage as operated in accordance with the invention.

FIG. 1 shows (in the conventionally stylized form) the final portions of a buried channel CCD. The floating diffusion amplifier at the output end of a CCD in accordance with the present invention is formed in a substrate of semiconductor material of one conductivity type, preferably p-type silicon, although n-type silicon and other semiconductor materials may be used. A buried charge transfer channel, indicated by the region above the dashed line in FIG. 1, is formed in the substrate by an implant of the other conductivity type and lies parallel to the substrate surface. FIG. 1 shows an n-type buried channel 2 beneath the surface of a p-type silicon substrate 4. Polysilicon-layer electrodes 10, 11, 12, 16, 18 and 20 overlying the buried channel are shown as horizontal lines. Clock OG1 is applied to the output gate electrodes 10 and 11, and is driven both negative and positive, from –3 volts to +4 volts. Clocks PR1 and PR2 are applied to the reset gate electrodes 16 and 20, respectively, and are both driven from 0 volts to about 8 volts.

Although the invention is described using an exemplary embodiment which employs a buried channel CCD, it is contemplated that it may also be practiced using surface channel devices.

A floating diffusion (FD) region 14 is a key feature of the amplifier. The FD region 14, along with a reset diffusion region 22, is formed with an implant of the same conductivity type as the buried charge transfer channel, with a relatively higher doping concentration. The FD region 14 is ohmically contacted and connected to the gate electrode 23 of a field effect transistor 30. The reset diffusion region 22 acts as a reset power source of potential VR (approximately 7 to 8 volts). The output transistor 30 has a drain electrode 24 connected to VDD and a source electrode 26 connected to a load resistor 28 and the input of the external circuitry (comprising correlated-double-sampling circuits, described below with reference to FIG. 3(a)). A pair of diffused regions of a conductivity type opposite that of the substrate are formed in the substrate adjacent to the charge transfer channel 2 and form the source 26 and drain 24 of the output transistor 30. The load resistor 28 is provided in the substrate and is part of the same diffused region which is the source 26 of the output transistor 30.

Figure 2:
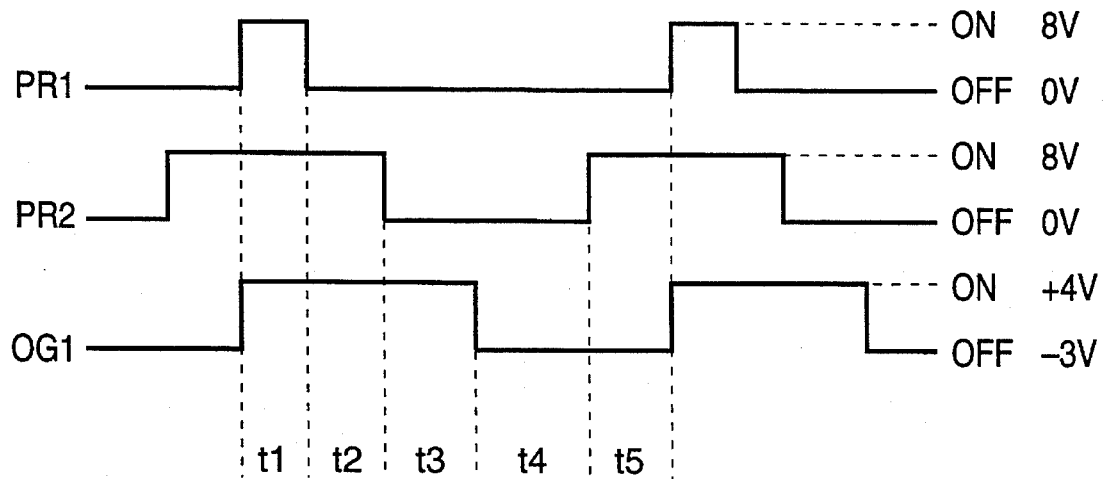
FIG. 2 is a timing diagram showing the operating voltage waveforms used to achieve two output signals for the same charge packet with two different gains.

FIG. 2 is a timing diagram showing the operating voltage waveforms used to achieve two output signals for the same charge packet with two different gains. In FIG. 2, The waveform polarities shown are for use with an n-channel CCD.

The CCD output gate electrodes 10, 11 and 12 are used in a conventional manner to transfer charge onto the FD region 14 during the negative-going transition of clock signal OG1. A d-c bias Vt (1 volt) is applied to the output gate electrode 12. A novel multi-gate reset structure is employed which includes a first reset gate electrode 16, a second reset gate electrode 20, and an additional storage region between the reset gate electrodes 16 and 20 controlled by a d-c bias Vx (approximately 7 to 8 volts), applied to a d-c gate electrode 18. Normally, the d-c gate electrode 18 would be biased relatively positive so that a surface inversion layer is always present under the electrode 18, thereby forming a linear capacitance, determined by the gate oxide capacitance, between this inversion layer and the gate of the d-c gate electrode 18.

The capacitance on the FD region 14 changes over time. When the capacitance on the FD region 14 is minimized, the maximum charge-to-voltage conversion gain is realized. A higher resistance between the FD region 14 and the gate electrode 23 of the output transistor 30 yields a lower gain.

For each signal charge packet that is processed, two output signals, each with different gains, are provided by dynamically controlling the capacitance on the FD region 14 using two external reset clocks.

As shown in FIG. 2, during time period t1, both clock signals PR1 and PR2 are high (about 8 volts). This forms a continuous conduction channel between the FD region 14 and the reset diffusion region 22, thus resetting the potential on the FD region 14 to the voltage VR.

At the beginning of time period t2, clock signal PR1 switches low (0 volts) which isolates (floats) the common electrical node consisting of the FD region 14 and the adjacent inversion layers under the reset gate electrode 16 and the d-c gate electrode 18. The total capacitance, Cfd1, on the FD region 14 at this point is a relatively large value (e.g., 80 fF). When PR1 switches low at the beginning of time period t2, an instantaneous kTC noise voltage component, Vn1, (which has an rms value of $(kT/Cfd1)^{1/2}$) is sampled onto the FD region 14. Therefore, at time t2 the voltage, Vfd2, on the FD region 14 equals VR+Vn1 (ignoring fixed offsets due to clock coupling). This voltage level is stored by a first correlated-double-sampling circuit CDS1 (shown in FIG. 3(a)) as the reference reset level for the low gain signal output.

At the beginning of time period t3, PR2 switches low (0 volts) which isolates the FD region 14 from the inversion layer under the d-c gate electrode 18 and causes a capacitance, Cfd2, to be formed on the FD region 14 (e.g., 20 fF). During time period t3, the voltage, Vfd3, on the FD region 14 equals VR+Vn2, where Vn2 is an instantaneous ktC noise component caused by the cascaded switching of PR1 and then PR2. Vn2 has an rms value, Vn2(rms), equal to the quadrature sum of the kTC noise from Cfd1 and Cfd2, i.e., Vn2(rms)=$((kT/Cfd1)+(kt/Cfd2))^{1/2}$. The voltage present on the FD region 14 at time t3 is stored by a second correlated-double-sampling circuit CDS2 (shown in FIG. 3(a)) as the reference reset level for the high gain signal output.

At the beginning of time period t4, OG1 switches low (−4 volts) which transfers a signal charge Qs onto the FD 14. During t4 the voltage, Vfd4, on the FD region 14 equals VR+Vn2+Qs/Cfd2. The CDS2 circuit subtracts the reference reset level VR+Vn2, obtained during time period t3, from Vfd4 to obtain a high gain signal voltage, Vhgs. Thus, Vhgs=Qs/Cfd2.

At the beginning of time period t5, PR2 switches high (about 8 volts) which causes the FD region 14 to be reconnected to the inversion layer under d-c gate electrode 18 with the same conditions which were present during time period t2 except for the addition of the signal charge Qs. Due to the conservation of the total charge present in this combined region, (since PR1 has remained off), and the commutative law of charge summation, the voltage, Vfd5, at the FD region 14 during t5 equals VR+Vn1+Qs/Cfd1. The CDS1 circuit subtracts the reference reset level VR+Vn1, obtained during time period t2, from Vfd5 to obtain the low gain signal voltage, Vlgs. Thus, Vlgs=Qs/Cfd1.

Note that when Qs is sufficiently high to saturate the high gain output, depending on the relative voltage levels on the output gate electrode 12 and PR2 (off), some of the signal charge Qs may backfill into the region under the output gate electrode 12 or may transfer into the region under the d-c gate electrode 18 before clock signal PR2 goes high at the beginning of time period t5. However, when PR2 does switch high, any signal charge which has backfilled under the output gate electrode 12 will be transferred to the FD region 14, completing the transfer of the total Qs signal onto the FD region 14 with the total capacitance of Cfd1.

Figure 3A:
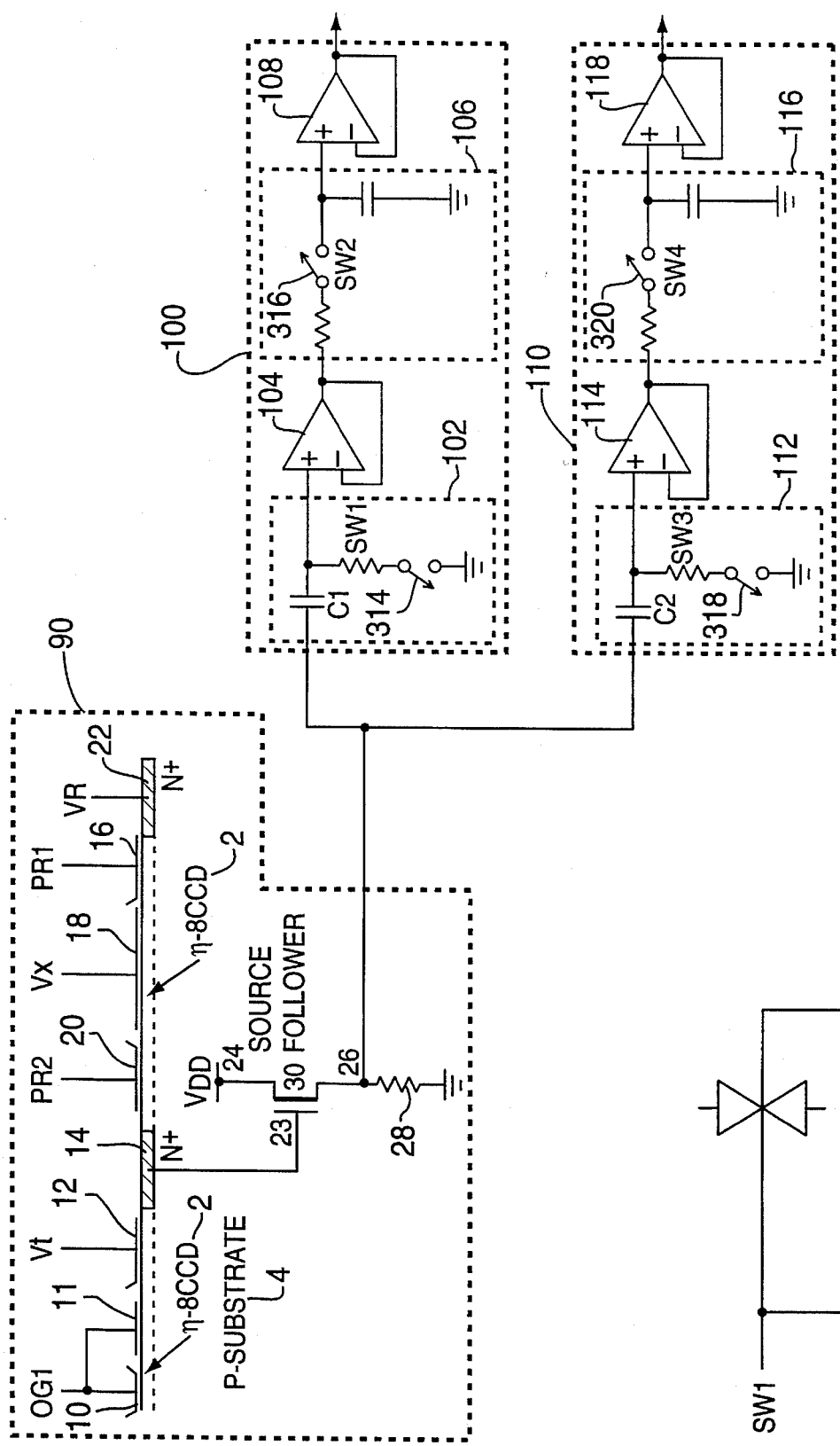
FIG. 3(a) is a circuit diagram of an exemplary embodiment of the present invention.
Figure 3B:
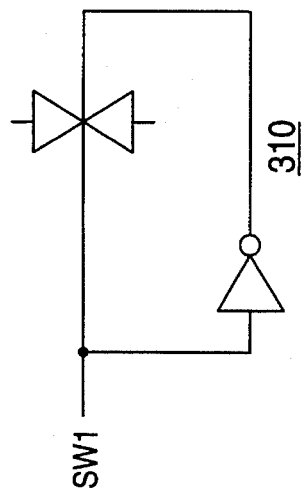
FIG. 3(b) is a circuit representation of an exemplary transmission gate for use in the embodiment of FIG. 3(a).
Figure 4:
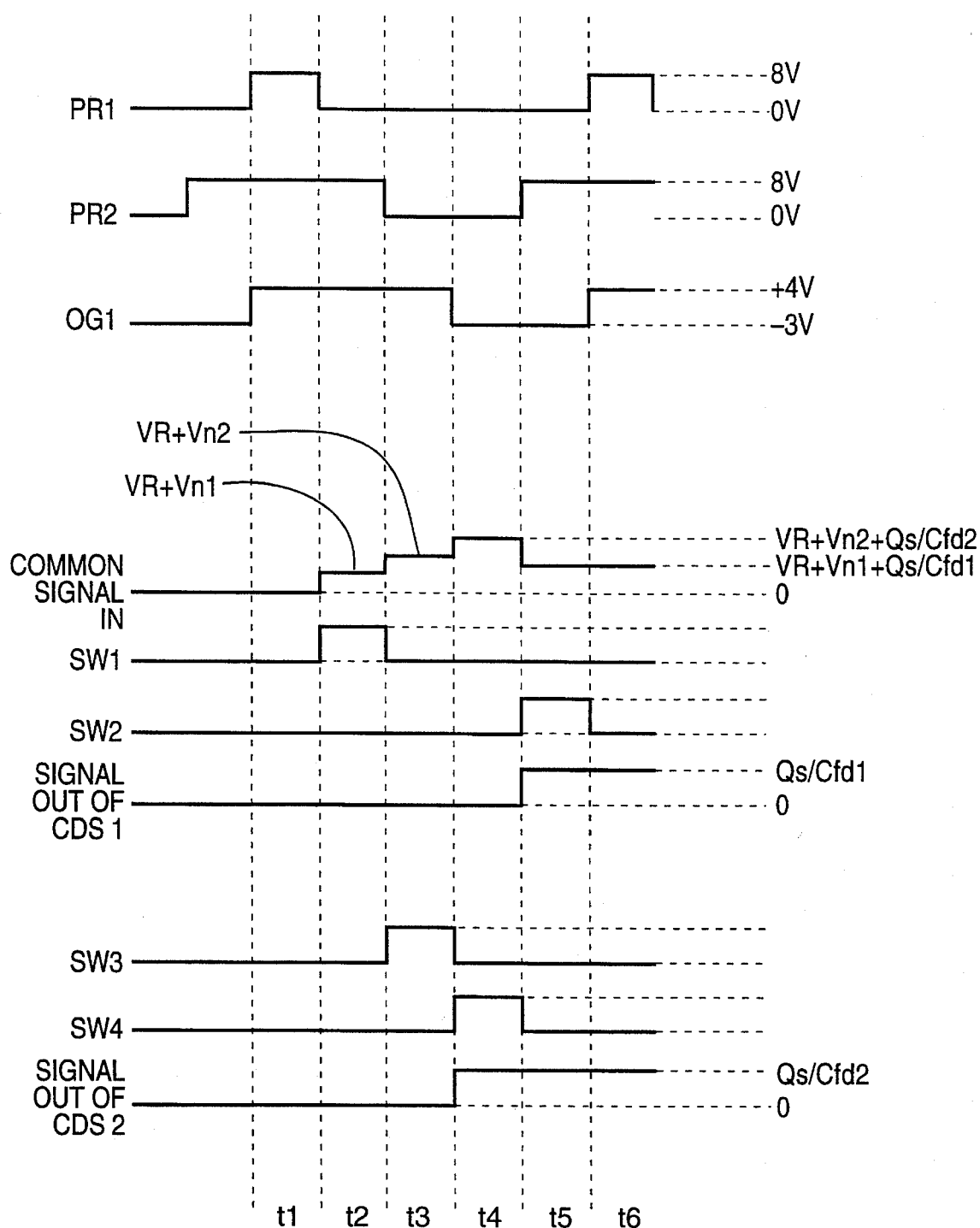
FIG. 4 is a timing diagram of the clocking levels applied to the embodiment of FIG. 3(a).

The operation of the floating diffusion amplifier in conjunction with the rest of the CCD can be understood by referring to FIGS. 3(a), 3(b) and 4.

Although the invention is described using an exemplary embodiment which employs a source follower circuit, it is contemplated that it may also be practiced using high input impedance amplifiers.

FIG. 3(a) is an electrical schematic of the floating diffusion amplifier of FIG. 1 along with correlated double sampling (CDS) output circuitry. The floating diffusion amplifier is shown within a dashed line rectangle 90 and two CDS circuits, referred to as CDS1 and CDS2, are shown within dashed line rectangles 100 and 110, respectively. As described above with reference to FIG. 1, the floating diffusion amplifier 90 comprises output gate electrodes 10, 11 and 12, reset gate electrodes 16 and 20, a source follower output transistor 30, a floating diffusion region 14, a reset diffusion region 22, and a d-c gate electrode 18.

CDS circuit 100 includes a clamp circuit 102, an op-amp voltage follower 104, a sample-and-hold circuit 106, and an op-amp voltage follower 108.

CDS circuit 110 includes a clamp circuit 112, an op-amp voltage follower 114, a sample-and-hold circuit 116, and an op-amp voltage follower 118.

The source 24 of the output transistor 30 is the output of the floating diffusion amplifier 90 and also forms the input to the CDS circuits 100 and 110. The four transmission gates 314, 316, 318 and 320 are represented by switches in FIG. 3(a). A circuit representation of an exemplary transmission gate 310 for use in the present invention is shown in FIG. 3(b).

FIG. 4 shows the timing diagram of clocks SW1, SW2, SW3 and SW4, using the same time periods t1, t2, . . . , t5 as in FIG. 2. During time period t1, the potential on the FD region 14 is reset to voltage VR.

At the beginning of time period t2, SW1 closes transmission gate 314. The voltage level on the FD region 14 (i.e., VR+Vn1) is stored by the CDS1 circuit 100 as the reference reset level for the low gain signal output.

At the beginning of time period t3, SW1 opens transmission gate 314 and SW3 closes transmission gate 318. The voltage level on the FD region 14 (i.e., VR+Vn2) is stored by the CDS2 circuit 110 as the reference reset level for the high gain signal output.

During time period t4, the voltage on the FD region 14 changes as the charge Qs is transferred to the region 14. The CDS2 circuit 110 subtracts the reference reset level from the present voltage provided by the transistor 30 (i.e., VR+Vn2+Qs/Cfd2) to obtain the high gain signal voltage. This voltage (i.e., Qs/Cfd2) is output by the CDS2 circuit 110.

At the beginning of time period t5, the CDS1 circuit 100 subtracts the stored reference reset level from the present voltage provided by the transistor 30 (i.e., VR+Vn1+Qs/Cfd1) to obtain the low gain signal voltage. This voltage (i.e., Qs/Cfd1) is output by the CDS1 circuit 100.

The operation of the CDS1 circuit 100 and the CDS2 circuit 110 is now described. Transmission gates 314, 316, 318 and 320 are represented by switches in FIG. 3(a). A circuit representation of an exemplary transmission gate 310 for use in the present invention is shown in FIG. 3(b).

The switching cycles of clocks SW1 and SW2 which control transmission gates 314 and 316, respectively, and the magnitude of the CDS1 input and output signals during the clock cycles are shown in FIG. 4. An input signal of VR+Vn1 is held by a capacitor C1 to establish a clamp level in the clamp circuit 102 when SW1 closes transmission gate 314 at time t2. The stored signal remains at this level after SW1 opens transmission gate 314 at time t3 and the input signal changes at time t5. After SW1 opens transmission gate 314, and SW2 closes transmission gate 316 at time t5, the held input signal, VR+Vn1, is subtracted from the current input signal, VR+Vn1+Qs/Cfd1, to give an output signal of Qs/Cfd1. This output signal is stored in the sample and hold circuit 106 and, so, remains Qs/Cfd1 after SW2 opens transmission gate 316 at time t6. This signal does not change until SW2 closes transmission gate 316 again.

Similarly, the switching cycles of clocks SW3 and SW4 which control transmission gates 318 and 320, respectively, and the magnitude of the CDS2 input and output signals during the clock cycles are shown in FIG. 4. An input signal of VR+Vn2 is held by a capacitor C2 to establish a clamp level in the clamp circuit 112 when SW3 closes transmission gate 318 at time t3. The stored signal remains at this level after SW3 opens transmission gate 318 at time t4 and the input signal changes at time t4. After SW3 opens transmission gate 318, and SW4 closes transmission gate 320 at time t4, the held input signal, VR+Vn2, is subtracted from the current input signal, VR+Vn2+Qs/Cfd2, to give an output signal of Qs/Cfd2. This output signal is stored in the sample and hold circuit 116 and, so, remains Qs/Cfd2 after SW4 opens transmission gate 320 at time t5. This signal does not change until SW4 closes transmission gate 320 again.

Thus, two output signals with different gains are provided for each signal charge packet. Through the use of the CDS circuits 100 and 110 in conjunction with the floating diffusion amplifier 90, the maximum SNR for low level signals can be provided along with an increased linear output dynamic range for higher level signals.

Although illustrated and described herein with reference to a certain specific embodiment, the present invention is nevertheless not intended to be limited to the details shown. Rather, various modifications may be made in the details within the scope and range of equivalence of the claims and without departing from the spirit of the invention.

What is claimed is:

1. A diffusion amplifier comprising:

a channel of a first conductivity type semiconductor material formed in a substrate of a second conductivity type semiconductor material;

a reset diffusion, disposed in an extension of said channel, connected to receive a reset potential;

a terminal for applying a signal charge, said terminal disposed adjacent to a surface of said substrate;

a floating diffusion disposed in said channel extension, said floating diffusion and said reset diffusion being of said first conductivity type of semiconductor material of relatively high doping compared to said channel and its extension;

a high input impedance amplifier circuit, including a field effect transistor, being disposed on said substrate, having a gate electrode ohmically coupled to said floating diffusion;

a first reset gate electrode disposed adjacent to said substrate surface, over said channel extension, and between said floating diffusion and said reset drain diffusion, to which first reset gate electrode reset pulses are recurrently applied;

a second reset gate electrode disposed adjacent to said substrate surface, over said channel extension, and between said floating diffusion and said first reset gate electrode, to which second reset gate electrode reset pulses are recurrently applied; and a d-c gate electrode disposed adjacent to said substrate surface, over said channel extension, and between said first reset gate electrode and said second reset gate electrode.

2. The amplifier of claim 1, wherein the channel is one of a buried channel and a surface channel.

3. The amplifier of claim 2, further comprising:

first and second correlated double sampling circuits coupled to receive an output of said high input impedance amplifier circuit for providing respective output signals representing a signal available at said floating diffusion amplified by respectively different gain factors.

4. The amplifier of claim 2, wherein the terminal for applying the signal charge includes a succession of gate electrodes to which clock signals are applied for transferring the signal charge, said succession of gate electrodes disposed adjacent to said surface.

5. The amplifier of claim 2, wherein the high input impedance amplifier circuit is a source follower circuit.

6. A diffusion amplifier comprising:

a channel of a first conductivity type semiconductor material formed in a substrate of a second conductivity type semiconductor material;

reset diffusion disposed in an extension of said channel coupled to receive a reset potential;

a floating diffusion disposed in said channel extension for transferring a signal;

means for applying a signal charge to the floating diffusion;

high input impedance amplification means, including a field effect transistor, ohmically coupled to said floating diffusion for providing an output representing an amplified version of said signal;

first reset gate electrode means positioned between said floating diffusion and said reset diffusion coupled to receive first reset gate electrode reset pulses;

second reset gate electrode means positioned adjacent to the floating diffusion means coupled to receive second reset gate electrode reset pulses;

d-c gate electrode means positioned between the first and second reset gate electrode means for creating an inversion layer and storing an electrical charge; and means for sequencing the floating diffusion means and the second reset gate electrode means to provide to the high input impedance amplification means a first signal level when the second reset gate electrode is in a first state and a second signal level, different from the first signal level, when the second reset gate electrode is in a second state, different from the first state.

7. The amplifier of claim 6, wherein the channel is one of a buried channel and a surface channel.

8. The amplifier of claim 7, further comprising:

first correlated double sampling means for receiving an output of said high input impedance amplification means for providing an output signal representing a signal available at said floating diffusion amplified as a first gain factor; and second correlated double sampling means for receiving an output of said high input impedance amplification means for providing an output signal representing a signal available at said floating diffusion amplified by a second gain factor different from the first gain factor.

9. The amplifier of claim 7, wherein the high input impedance amplification means is a source follower means.

* * * * *